US012658271B2

(12) United States Patent
Rajaiah et al.

(10) Patent No.: US 12,658,271 B2
(45) Date of Patent: Jun. 16, 2026

(54) DETERMINISTIC TEST PROGRAM GENERATION FOR EVALUATING CACHE COHERENCY

(71) Applicant: INTERNATIONAL BUSINESS MACHINES CORPORATION, Armonk, NY (US)

(72) Inventors: Nandhini Rajaiah, Bangalore (IN); Manoj Dusanapudi, Bangalore (IN); Larry Leitner, Austin, TX (US); Shakti Kapoor, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 304 days.

(21) Appl. No.: 18/501,111

(22) Filed: Nov. 3, 2023

(65) Prior Publication Data

US 2025/0149103 A1      May 8, 2025

(51) Int. Cl.
*G11C 29/10* (2006.01)

(52) U.S. Cl.
CPC .................................... *G11C 29/10* (2013.01)

(58) Field of Classification Search
None
See application file for complete search history.

(56) References Cited

U.S. PATENT DOCUMENTS

| | | | |
|---|---|---|---|
| 8,930,760 B2 | 1/2015 | Alapati et al. | |
| 10,635,555 B2 | 4/2020 | Grosser et al. | |
| 2004/0210721 A1* | 10/2004 | Detjens | G06F 11/261 |
| | | | 711/141 |
| 2017/0220440 A1* | 8/2017 | Dusanapudi | G06F 11/2242 |

OTHER PUBLICATIONS (Lyu et al.) Directed Test Generation for Validation of Cache Coherence Protocols—(2019)—(IEEE). (Year: 2019).*
(Continued)

*Primary Examiner* — Mark D Featherstone
*Assistant Examiner* — Matthew W Wahlin
(74) *Attorney, Agent, or Firm* — Edward Wixted, Esq.; Kevin P. Radigan, Esq.; Heslin Rothenberg Farley & Mesiti P.C.

(57) ABSTRACT

A cache coherency test process is provided which includes deterministically generating a test program to test cache coherency in a computing environment including at least one processing unit. The deterministically generating includes producing cache state test sequences using graph traversal, where the cache state test sequences include closed paths of cache-affecting operations, and where using graph traversal includes traversing one or more state graphs with nodes representing cache states and edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. Further, the process includes initiating executing of the test program in the computing environment to test the cache coherency.

17 Claims, 16 Drawing Sheets

(56) References Cited

OTHER PUBLICATIONS (Dianati)—Unwinding the hairball graph: pruning algorithms for weighted complex networks—(2016)—(PhysRev) (Year: 2016).*

Anderson, Tom, "Why Is Cache Coherency So Hard to Verify?", EDACafe, published Online Feb. 19, 2016, at: https://www10.edacafe.com/blogs/thebrekertrekker/2016/02/19/why-is-cache-coherency-so-hard-to-verify/ (5 pages) (Year: 2016).

Deorio et al., "Post-Silicon Verification for Cache Coherence", IEEE Int'l. Conference on Computer Design (ICCD), Published Nov. 2008 (9 pages) (Year: 2008).

Kumar et al., "Validating Multi-Processor Cache Coherence Mechanisms Under Diminished Observability", IEEE 28th Asian Test Symposium (ATS), published Dec. 10, 2019 (6 pages) (Year: 2019).

Lyu et al., "Directed Test Generation for Validation of Cache Coherence Protocols", IEEE Transactions on Computer-Aided Design of Integrated Circuits and Systems, published Feb. 2, 2018 (14 pages) (Year: 2018).

Manerkar et al., "CCICheck: Using µhb Graphs to Verify the Coherence-Consistency Interface, MICRO-48: Proceedings of the 48th Int'l. Symposium on Microarchitecture", published Dec. 5, 2015 (12 pages) (Year: 2015).

Qin et al., "Automated Generation of Directed Tests for Transition Coverage in Cache Coherence Protocols", Design, Automation & Test in Europe Conference & Exhibition (DATE), published Mar. 12, 2012 (6 pages) (Year: 2012).

* cited by examiner

100

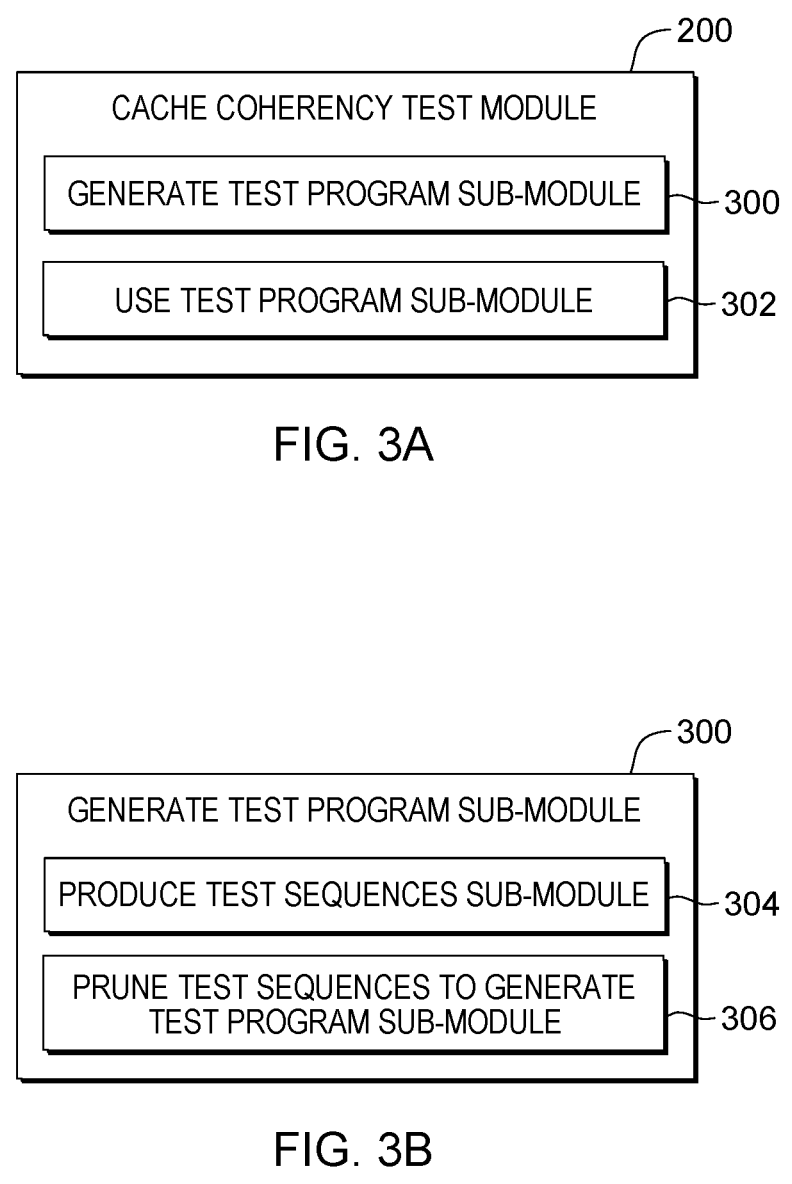

200

CACHE COHERENCY TEST MODULE

GENERATE TEST PROGRAM SUB-MODULE  ~300

USE TEST PROGRAM SUB-MODULE  ~302

GENERATE TEST PROGRAM SUB-MODULE

PRODUCE TEST SEQUENCES SUB-MODULE  ~304

PRUNE TEST SEQUENCES TO GENERATE
TEST PROGRAM SUB-MODULE  ~306

FIG. 3B

CACHE STATES

| | I | S | S2 | I2 | T | T2 | T3 | T4 | M | 2M | M3 |
|---|---|---|---|---|---|---|---|---|---|---|---|
| I | x | x | 1 | x | x | x | x | x | 1 | 1 | 1 |
| S | 1 | x | 1 | 1 | x | x | x | x | 1 | x | 1 |
| S2 | 1 | 1 | x | 1 | x | x | x | x | 1 | x | 1 |
| I2 | x | x | 1 | x | x | x | x | x | 1 | 1 | 1 |
| T | x | x | x | 1 | x | x | x | x | 1 | x | 1 |
| T2 | x | x | x | 1 | x | x | x | x | 1 | x | 1 |
| T3 | 1 | x | x | x | x | 1 | x | x | 1 | x | 1 |
| T4 | 1 | x | x | x | 1 | x | x | x | 1 | x | 1 |
| M | 1 | x | x | 1 | 1 | x | x | 1 | x | x | 1 |
| M2 | 1 | x | x | 1 | x | 1 | 1 | x | 1 | x | 1 |
| M3 | 1 | x | x | 1 | 1 | x | x | 1 | 1 | x | x |

FIG. 5

STATE TRANSITION WEIGHTED MULTIGRAPH

CACHE STATES

|   | I | M | M2 | S1 | T | T2 |
|---|---|---|----|----|---|----|
| I |   | Self Wr,15 | Self Rd,1 | Other core Wr followed by Self Rd,15 |   |   |
| M | Flush,1 |   |   |   | Self Wr followed by other core Rd,1 |   |
| M2 | Flush,1 | Self Wr,15 |   |   |   | Self Rd followed by other core Rd,1 |
| S1 | Flush,1 | Self Wr,15 |   |   |   |   |
| T | Flush,1 |   |   |   |   |   |
| T2 | Flush,1 | Self Wr,15 |   |   |   |   |

ADJACENCY MATRIX
EACH ENTRY REPRESENTS (OPERATION, PRIORITY)

FIG. 7B (CACHE STATES — vertical label on left)

CACHE STATE TRANSITION

| | I->M | T->I | M->I | S->I | M2->I | T2->I | M->T | .. | M2->T2 |
|---|---|---|---|---|---|---|---|---|---|
| I->M | 0 | 1 | 1 | 1 | 1 | 1 | 0 | .. | 0 |
| T->I | 0 | 0 | 0 | 0 | 0 | 0 | 0 | .. | 0 |
| M->I | 0 | 0 | 0 | 0 | 0 | 0 | 0 | .. | 0 |
| S->M | 0 | 1 | 0 | 0 | 0 | 1 | 0 | .. | 0 |
| M2->I | 0 | 0 | 0 | 0 | 0 | 0 | 0 | .. | 0 |
| I->S | 0 | 0 | 0 | 0 | 0 | 0 | 1 | .. | 1 |
| M->T | 0 | 0 | 0 | 0 | 0 | 0 | 0 | .. | 0 |
| .. | .. | .. | .. | .. | .. | .. | .. | .. | .. |
| M2->T2 | 0 | 0 | 0 | 0 | 0 | 0 | 0 | .. | 0 |

CACHE STATE TRANSITION

FIG. 8A

FOREST OF
DEPENDENCY
GRAPHS

CLOSED PATH 1
CLOSED PATH 2
CLOSED PATH 3
CLOSED PATH 4
CLOSED PATH 5
CLOSED PATH 6
CLOSED PATH 7
CLOSED PATH 8

900

1. I->M2->T2->M->I
2. I->S->M->T->I
3. I->M->T->I
4. I->S->M->I
5. I->M2->T2->I
6. I->M2->M->I
7. I->S->I
8. I->M->I
9. I->M2->I
10. I->M->T->I
11. I->S->I
12. I->M->I

USE GRAPH COLORING PROCESS TO READJUST PRIORITIES OF PATHS

1000

1001

1002

(m)
(m-1)
(m-2)

IM2T2I
ISMTI
IM2T2MI
IMI
IM2I
IMTI
ISMI
ISI
IM2I

• DEPENDING ON THE "COLOR" ASSIGNED, THE SEQUENCES ARE REPRIORITIZED. HERE, IMTI AND ISI ARE REPRIORITIZED, SINCE THEY ARE DUPLICATE SEQUENCES (AS SHOWN IN FIG. 10B)

Test sequence for path 2:
core 0: I->S->M->T->I
core 1: I->M->T->I

| Node 0<br>Core 0 | Node 0<br>Core 1 |
|---|---|
|  | Wr1 |
| Rd1 |  |
| Wr1 |  |
|  | Rd1 |
| Flush1 |  |
|  | Flush1 |

FIG. 11C

Test sequence for path 5:
core 0: I->M->T->I
core 1: I->S->I

| Node 0<br>Core0 | Node 0<br>Core1 |
|---|---|
| Wr1 |  |
|  | Rd1 |
| Flush1 |  |
|  | Flush1 |

FIG. 11B

IDENTIFY SECONDARY
TRANSITIONS

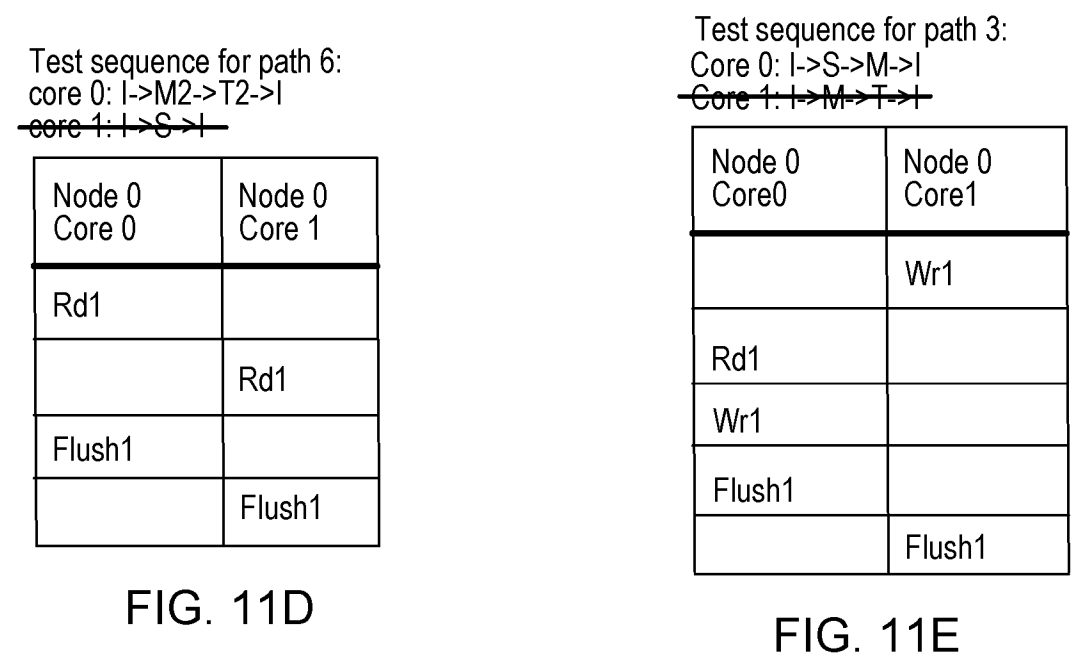

Test sequence for path 3:
Core 0: I->S->M->I
Core 1: I->M->T->I

| Node 0 Core0 | Node 0 Core1 |
|---|---|
| | Wr1 |
| Rd1 | |
| Wr1 | |
| Flush1 | |
| | Flush1 |

FIG. 11E

Test sequence for path 6:
core 0: I->M2->T2->I
core 1: I->S->I

| Node 0 Core 0 | Node 0 Core 1 |
|---|---|
| Rd1 | |
| | Rd1 |
| Flush1 | |
| | Flush1 |

FIG. 11D

DETERMINISTIC TEST PROGRAM GENERATION FOR EVALUATING CACHE COHERENCY

BACKGROUND

This disclosure relates generally to facilitating processing within a computing environment, and more particularly, to enhanced cache coherency testing within a computing environment.

Cache coherency refers to the uniformity of data across caches of a computing environment, or computer architecture. To maintain correctness of caching operations within a computing environment, such as within a multiprocessor system, cache coherency protocols are used. There are many different protocols for maintaining cache coherency, such as the shared invalid (SI) protocol, modified shared invalid (MSI) protocol, modified exclusive shared (MES) protocol, modified exclusive shared invalid (MESI) protocol, modified owned shared invalid (MOSI) protocol, modified owned exclusive shared invalid (MOESI) protocol, recent tagged modified exclusive shared invalid (RT MESI), etc.

The functional validation or testing of a cache coherency protocol implementation can be a challenging problem within today's computing environments, particularly given that current server processors can have ten or more cache states, and about fifty valid cache state transitions.

SUMMARY

Certain shortcomings of the prior art are overcome, and additional advantages are provided herein through the provision of a computer-implemented method of facilitating processing within a computing environment. The computer-implemented method includes deterministically generating a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, deterministically generating includes pruning the cache state test sequences, using closed-path graph analysis, to generate the test program, where the test program has a selected cache coherence test coverage using chosen cache state test sequences obtained from pruning the cache state test sequences. Further, the computer-implemented method includes initiating executing of the test program in the computing environment to test the cache coherency. Advantageously, the method facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, processing time of the test program and number of unique test programs required are reduced.

In an embodiment, deterministically generating the test program further includes generating a weighted multigraph to facilitate producing the cache state test sequences using graph traversal, where the one or more state graphs include the weighted multigraph, and where the connecting edges of the weighted multigraph further include weight priorities used in the pruning of the cache state test sequences. Deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency.

In another embodiment, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences, or which allows a coherence test coverage to be obtained which is deemed desirable based on previous generation processors or complexity of the computing environment. In another embodiment, priority can be assigned based on the state space being created, for instance, to prioritize testing of a new state or transition within the computing environment.

In a further embodiment, generating the weighted multigraph includes generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processing units causes a cache state transition in another processing unit of the multiple processing units. Generating one or more forest of dependency graphs facilitates pruning the cache state test sequences to avoid duplicate cache state transitions, identifying cache state transitions required in other processing units to cause desired transitions, and to facilitate generating a unique set of chosen cache state test sequences for the test program that provides a selected cache coherence coverage.

In another embodiment, the computer-implemented method further includes identifying the closed paths of cache-affecting operations from the weighted multigraph, where the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

In another embodiment, processing the identified closed paths includes, for a selected closed path of the identified closed paths, identifying any secondary transitions of the selected closed path in the other processing unit, and using graph coloring processing to facilitate reprioritizing a processing order of the identified closed paths, where the graph coloring processing produces a graph with nodes representing closed paths and connecting edges representing secondary paths generated as a result of the closed paths. Advantageously, graph coloring processing facilitates pruning the cache state test sequences to arrive at the test program with the selected cache coherence test coverage, where the test program includes a unique set of cache state transitions for testing cache coherency. Reprioritizing the processing order of the identified closed paths in association with graph coloring processing facilitates choosing a unique set of cache state test sequences for the test program which provide the selected cache coherence test coverage, and facilitates providing an optimum set of transitions for a desired cache coherency coverage.

In one or more embodiments, the selected cache coherence test coverage ensures that executing the test program generates all desired cache state transitions in the computing environment for testing the cache coherency. Advantageously, a test program is generated deterministically, with the desired cache state transitions for testing cache coherency within the computing environment. In one or more embodiments, the selected cache coherence test coverage is an optimal cache coherence test coverage for the at least one processing unit, with a minimum number of cache state test sequences or cache state transitions being included, thereby providing a more efficient and less costly cache coherency test process.

In another embodiment, the computer-implemented method further includes identifying, based on executing the test program in the computing environment, a cache coherency issue within the computing environment, and initiating a cache coherency-related production change to the computing environment to generate a modified computing environment with a cache-related modification to address the identified cache coherency issue. Advantageously, processing within the computing environment is facilitated by identifying a cache coherency issue and initiating a cache coherency-related production change to address the identified cache coherency issue.

In an embodiment, the computer-implemented method further includes initiating executing of another test program in the modified computing environment to test cache coherency of the modified computing environment. By initiating executing of another test program in the modified computing environment to test cache coherency of the modified computing environment, effectiveness of the cache coherency-related production change is confirmed by validating cache coherency of the modified computing environment.

In another aspect, a computer system for facilitating processing within a computing environment is provided. The computer system includes a memory and at least one processor in communication with the memory, where the computer system is configured to perform a method which includes deterministically generating a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. The method also includes initiating executing of the test program in the computing environment to test the cache coherency. Advantageously, the method facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, processing time of the test program and number of unique test programs required are reduced.

In an embodiment of the computer system, deterministically generating of the test program further includes generating a weighted multigraph to facilitate producing the cache state test sequences using graph traversal, where the one or more state graphs include the weighted multigraph, and where the connecting edges of the weighted multigraph further include weight priorities used in the pruning of the cache state test sequences. Deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency.

In another embodiment of the computer system, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences, or which allows a coherence test coverage to be obtained which is deemed desirable based on previous generation processors or complexity of the computing environment. In another embodiment, priority can be assigned based on the state space being created, for instance, to prioritize testing of a new state or transition within the computing environment.

In another embodiment of the computer system, generating the weighted multigraph further includes generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processor units causes a cache state transition in another processing unit of the multiple processing units. Generating one or more forest of dependency graphs facilitates pruning the cache state test sequences to avoid duplicate cache state transitions, identifying cache state transitions required in other processing units to cause desired transitions, and to facilitate generating a unique set of chosen cache state test sequences for the test program that provides a selected cache coherence coverage.

In a further embodiment of the computer system, the method includes identifying the closed paths of cache-affecting operations from the weighted multigraph, and the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

In an embodiment of the computer system, processing the identified closed paths includes, for a selected closed path of the identified closed paths, identifying any secondary transitions of the selected closed path in the other processing unit, and using graph coloring processing to facilitate reprioritizing a processing order of the identified closed paths, where the graph coloring processing produces a graph with nodes representing closed paths and connecting edges representing secondary paths generated as a result of processing the closed paths. Advantageously, graph coloring processing facilitates pruning the cache state test sequences to arrive at the test program with the selected cache coherence test coverage, where the test program includes a unique set of cache state transitions for testing cache coherency. Reprioritizing the processing order of the identified closed paths in association with graph coloring processing facilitates choosing a unique set of cache state test sequences for the test program which provides the selected cache coherence test coverage, and facilitate providing an optimum set of transitions for a desired cache coherency coverage.

In a further embodiment of the computer system, the selected cache coherence test coverage ensures that executing the test program generates all desired cache state transitions in the computing environment for testing the cache coherency. Advantageously, a test program is generated deterministically, with the desired cache state transitions for testing cache coherency within the computing environment. In one or more embodiments, the selected cache coherence test coverage is an optimal cache coherence test coverage for the at least one processing unit, with a minimum number of cache state test sequences or cache state transitions being included, thereby providing a more efficient and less costly cache coherency test process.

In a further aspect, a computer program product for facilitating processing within a computing environment is provided. The computer program product includes one or more computer-readable storage media and program instructions collectively stored on the one or more computer-readable storage media readable by at least one processor to deterministically generate a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. Further, the program instructions are readably by the at least one processor to initiate executing of the test program in the computing environment to test the cache coherency. Advantageously, the computer program product facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, processing time of the test program and number of unique test programs required are reduced.

In an embodiment of the computer program product, the deterministically generating the test program further includes generating a weighted multigraph to facilitate producing of the cache state test sequences using graph traversal, where the one or more state graphs include the weighted multigraph, and where connecting edges of the weighted multigraph further include weight priorities used in the pruning of the cache state test sequences. Deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency.

In another embodiment of the computer program product, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences.

In a further embodiment of the computer program product, the program instructions are readable by the at least one processor to identify the closed paths of cache-affecting operations from the weighted multigraph, and the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 3A depicts one embodiment of a computer program product with a cache coherency test module, in accordance with one or more aspects of the present disclosure;

FIG. 3B depicts one embodiment of a computer program product with a generate test program sub-module, in accordance with one or more aspects of the present disclosure;

FIG. 5 depicts one embodiment of a data structure with exemplary cache states and transitions between cache states in a computing environment, in accordance with one or more aspects of the present disclosure;

FIG. 7B depicts an adjacency data structure representation of the state transition weighted multigraph of FIG. 7A, in accordance with one or more aspects of the present disclosure;

FIG. 8A depicts one example of a data structure that indicates whether a cache state transition in one processing unit of a computing environment causes a cache state transition in another processing unit, in accordance with one or more aspects of the present disclosure;

FIG. 11A depicts exemplary identified sets of closed paths in a computing environment during a cache coherency test workflow, in accordance with one or more aspects of the present disclosure; and FIGS. 11B-11E illustrate exemplary test sequences between cores of a node for different paths of a weighted multigraph, in accordance with one or more aspects of the present disclosure.

DETAILED DESCRIPTION

Figure 1:
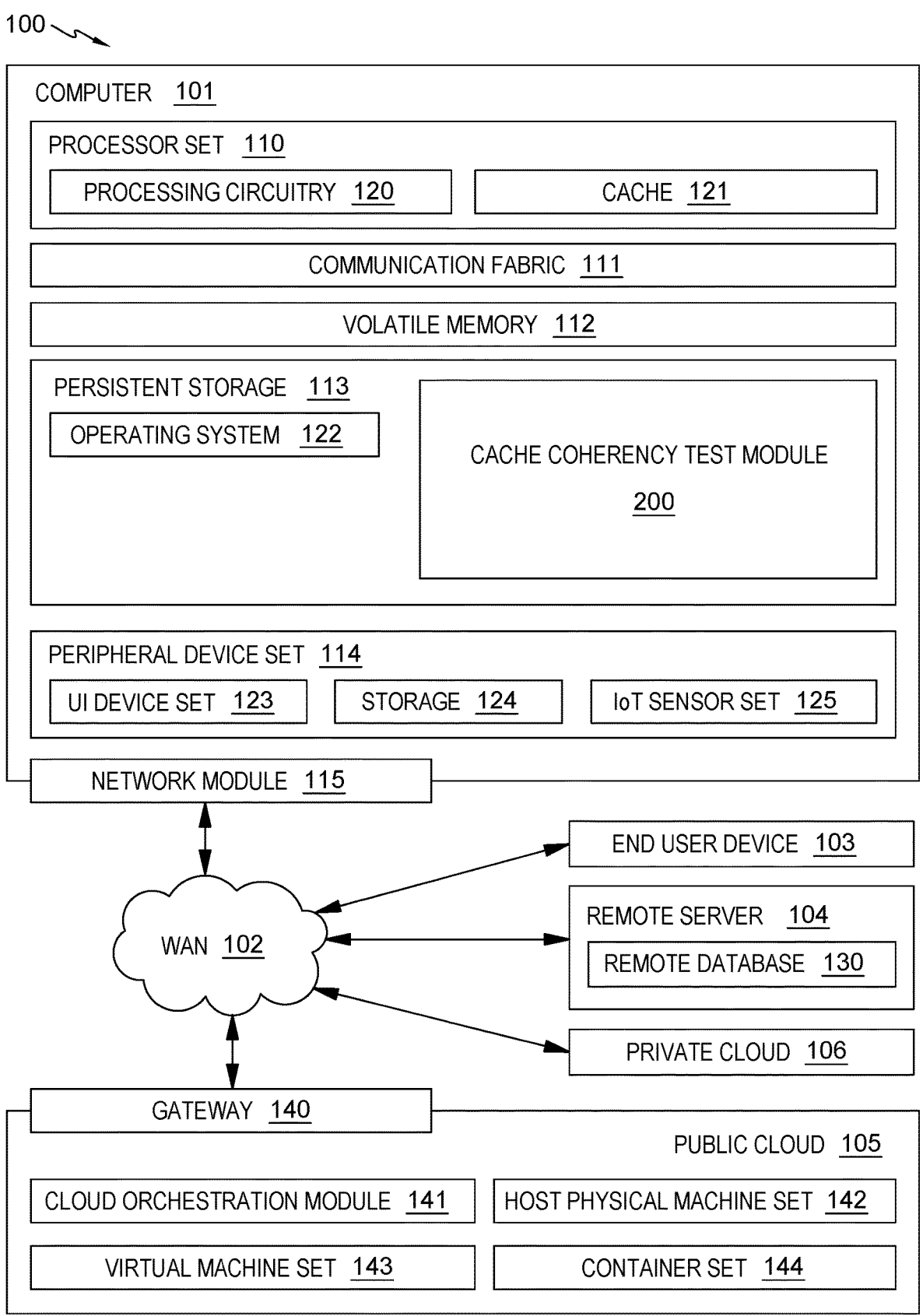
FIG. 1 depicts one example of a computing environment to include and/or use one or more aspects of the present disclosure.

Provided herein, in one or more aspects, is a computer-implemented method of facilitating processing within a computing environment. The computer-implemented method includes deterministically generating a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. Further, the computer-implemented method includes initiating executing of the test program in the computing environment to test the cache coherency. Advantageously, the method facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, processing time of the test program and number of unique test programs required are reduced.

In an embodiment, deterministically generating the test program further includes generating a weighted multigraph to facilitate producing the cache state test sequences using graph traversal, where the one or more state graphs include the weighted multigraph, and where the connecting edges of the weighted multigraph further include weight priorities used in the pruning of the cache state test sequences. Deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency.

In another embodiment, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences, or which allows a coherence test coverage to be obtained which is deemed desirable based on previous generation processors or complexity of the computing environment. In another embodiment, priority can be assigned based on the state space being created, for instance, to prioritize testing of a new state or transition within the computing environment.

In a further embodiment, generating the weighted multigraph includes generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processing units causes a cache state transition in another processing unit of the multiple processing units. Generating one or more forest of dependency graphs facilitates pruning the cache state test sequences to avoid duplicate cache state transitions, identifying cache state transitions required in other processing units to cause desired transitions, and to facilitate generating a unique set of chosen cache state test sequences for the test program that provides a selected cache coherence coverage.

In another embodiment, the computer-implemented method further includes identifying the closed paths of cache-affecting operations from the weighted multigraph, where the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

In another embodiment, processing the identified closed paths includes, for a selected closed path of the identified closed paths, identifying any secondary transitions of the selected closed path in the other processing unit, and using graph coloring processing to facilitate reprioritizing a processing order of the identified closed paths, where the graph coloring processing produces a graph with nodes representing closed paths and connecting edges representing secondary paths generated as a result of the closed paths. Advantageously, graph coloring processing facilitates pruning the cache state test sequences to arrive at the test program with the selected cache coherence test coverage, where the test program includes a unique set of cache state transitions for testing cache coherency. Reprioritizing the processing order of the identified closed paths in association with graph coloring processing facilitates choosing a unique set of cache state test sequences for the test program which provide the selected cache coherence test coverage, and facilitates providing an optimum set of transitions for a desired cache coherency coverage.

In one or more embodiments, the selected cache coherence test coverage ensures that executing the test program generates all desired cache state transitions in the computing environment for testing the cache coherency. Advantageously, a test program is generated deterministically, with the desired cache state transitions for testing cache coherency within the computing environment. In one or more embodiments, the selected cache coherence test coverage is an optimal cache coherence test coverage for the at least one processing unit, with a minimum number of cache state test sequences or cache state transitions being included, thereby providing a more efficient and less costly cache coherency test process.

In another embodiment, the computer-implemented method further includes identifying, based on executing the test program in the computing environment, a cache coherency issue within the computing environment, and initiating a cache coherency-related production change to the computing environment to generate a modified computing environment with a cache-related modification to address the identified cache coherency issue. Advantageously, processing within the computing environment is facilitated by identifying a cache coherency issue and initiating a cache coherency-related production change to address the identified cache coherency issue.

In an embodiment, the computer-implemented method further includes initiating executing of another test program in the modified computing environment to test cache coherency of the modified computing environment. By initiating executing of another test program in the modified computing environment to test cache coherency of the modified computing environment, effectiveness of the cache coherency-related production change is confirmed by validating cache coherency of the modified computing environment.

In another aspect, a computer system for facilitating processing within a computing environment is provided. The computer system includes a memory and at least one processor in communication with the memory, where the computer system is configured to perform a method which includes deterministically generating a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. The method also includes initiating executing of the test program in the computing environment to test the cache coherency. Advantageously, the method facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, processing time of the test program and number of unique test programs required are reduced.

In an embodiment of the computer system, deterministically generating of the test program further includes generating a weighted multigraph to facilitate producing the cache state test sequences using graph traversal, where the one or more state graphs include the weighted multigraph, and where the connecting edges of the weighted multigraph further include weight priorities used in the pruning of the cache state test sequences. Deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency.

In another embodiment of the computer system, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences, or which allows a coherence test coverage to be obtained which is deemed desirable based on previous generation processors or complexity of the computing environment. In another embodiment, priority can be assigned based on the state space being created, for instance, to prioritize testing of a new state or transition within the computing environment.

In another embodiment of the computer system, generating the weighted multigraph further includes generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processor units causes a cache state transition in another processing unit of the multiple processing units. Generating one or more forest of dependency graphs facilitates pruning the cache state test sequences to avoid duplicate cache state transitions, identifying cache state transitions required in other processing units to cause desired transitions, and to facilitate generating a unique set of chosen cache state test sequences for the test program that provides a selected cache coherence coverage.

In a further embodiment of the computer system, the method includes identifying the closed paths of cache-affecting operations from the weighted multigraph, and the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

In an embodiment of the computer system, processing the identified closed paths includes, for a selected closed path of the identified closed paths, identifying any secondary transitions of the selected closed path in the other processing unit, and using graph coloring processing to facilitate reprioritizing a processing order of the identified closed paths, where the graph coloring processing produces a graph with nodes representing closed paths and connecting edges representing secondary paths generated as a result of processing the closed paths. Advantageously, graph coloring processing facilitates pruning the cache state test sequences to arrive at the test program with the selected cache coherence test coverage, where the test program includes a unique set of cache state transitions for testing cache coherency. Reprioritizing the processing order of the identified closed paths in association with graph coloring processing facilitates choosing a unique set of cache state test sequences for the test program which provides the selected cache coherence test coverage, and facilitate providing an optimum set of transitions for a desired cache coherency coverage.

In a further embodiment of the computer system, the selected cache coherence test coverage ensures that executing the test program generates all desired cache state transitions in the computing environment for testing the cache coherency. Advantageously, a test program is generated deterministically, with the desired cache state transitions for testing cache coherency within the computing environment. In one or more embodiments, the selected cache coherence test coverage is an optimal cache coherence test coverage for the at least one processing unit, with a minimum number of cache state test sequences or cache state transitions being included, thereby providing a more efficient and less costly cache coherency test process.

In a further aspect, a computer program product for facilitating processing within a computing environment is provided. The computer program product includes one or more computer-readable storage media and program instructions collectively stored on the one or more computer-readable storage media readable by at least one processor to deterministically generate a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. Further, the program instructions are readably by the at least one processor to initiate executing of the test program in the computing environment to test the cache coherency. Advantageously, the computer program product facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, processing time of the test program and number of unique test programs required are reduced.

In an embodiment of the computer program product, the deterministically generating the test program further includes generating a weighted multigraph to facilitate producing of the cache state test sequences using graph traversal, where the one or more state graphs include the weighted multigraph, and where connecting edges of the weighted multigraph further include weight priorities used in the pruning of the cache state test sequences. Deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency.

In another embodiment of the computer program product, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences.

In a further embodiment of the computer program product, the program instructions are readable by the at least one processor to identify the closed paths of cache-affecting operations from the weighted multigraph, and the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

In another aspect, a method, computer system and computer program product are provided, which include, and/or implement, a method of facilitating processing within a computing environment. The method includes deterministically generating a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache coherence test coverage using chosen cache state test sequences obtained from pruning the cache state test sequences. Deterministically generating the test program further includes generating a weighted multigraph to facilitate producing the cache state test sequences using graph traversal, where the one or more state graphs include the weighted multigraph, and where the connecting edges of the weighted multigraph further include weight priorities used in the pruning of the cache state test sequences. Further, in one or more embodiments, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of the multiple processing units in order to process those state cache transitions before other cache state transitions of the weighted multigraph in obtaining the chosen cache state test sequences of the test program. Further, generating the weighted multigraph includes, in one or more embodiments, generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processing units causes a cache state transition in another processing unit of the multiple processing units. Further, the computer-implemented method includes initiating executing of the test program in the computing environment to test the cache coherency. Advantageously, the method facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherence test coverage. In one or more embodiments, an optimum set of chosen cache state test sequences is obtained for a desired cache coherence test coverage. By pruning the produced cache state test sequences to arrive at the test program, the length of the test program, the processing time of the test program and number of unique test programs required are reduced. Further, deterministically generating the test program using a weighted multigraph facilitates producing the cache state test sequences using graph traversal, and the weight priorities facilitate pruning the cache state test sequences to, for instance, avoid duplicate cache state transitions, and facilitate arriving at a unique set of transitions that can cause multiple state transitions in the computing environment in the order of priority to include in the test program for testing the cache coherency. Further, assigning weight priorities to the connecting edges of the weighted multigraph facilitates prioritizing certain cache state transitions and arriving at the chosen cache state test sequences, which allows, for instance, the selected cache coherence test coverage to be obtained using a minimum number of test sequences, or which allows a coherence test coverage to be obtained which is deemed desirable based on previous generation processors or complexity of the computing environment. In another embodiment, priority can be assigned based on the state space being created, for instance, to prioritize testing of a new state or transition within the computing environment. In addition, generating one or more forest of dependency graphs facilitates pruning the cache state test sequences to avoid duplicate cache state transitions. identifying cache state transitions required in other processing units to cause desired transitions, and to facilitate generating a unique set of chosen cache state test sequences for the test program that provides a selected cache coherency coverage.

In another embodiment, the method further includes identifying the closed paths of cache-affecting operations from the weighted multigraph, where the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of the cache-affecting operations in the cache state test sequences allows higher priority cache state test sequences, or closed paths, to be considered first for inclusion in the test program, thereby increasing the likelihood that the higher priority transitions are included in the resultant test program.

In another embodiment, processing the identified closed paths includes, for a selected closed path of the identified closed paths, identifying any secondary transitions of the selected closed path in the other processing unit, and using graph coloring processing to facilitate reprioritizing a processing order of the identified closed paths, where the graph coloring processing produces a graph with nodes representing closed paths and connecting edges representing secondary paths generated as a result of the closed paths. Advantageously, graph coloring processing facilitates pruning the cache state test sequences to arrive at the test program with the selected cache coherence test coverage, where the test program includes a unique set of cache state transitions for testing cache coherency. Reprioritizing the processing order of the identified closed paths in association with graph coloring processing facilitates choosing a unique set of cache state test sequences for the test program which provide the selected cache coherence test coverage, and facilitates providing an optimum set of transitions for a desired cache coherency coverage.

In one or more embodiments, the selected cache coherence test coverage ensures that executing the test program generates all desired cache state transitions in the computing environment for testing the cache coherency. Advantageously, a test program is generated deterministically, with the desired cache state transitions for testing cache coherency within the computing environment. In one or more embodiments, the selected cache coherence test coverage is an optimal cache coherence test coverage for the at least one processing unit, with a minimum number of cache state test sequences or cache state transitions being included, thereby providing a more efficient and less costly cache coherency test process.

In a further aspect, a method, computer system, and computer program product are provided, which include, or implement, a method of facilitating processing within a computing environment, which includes deterministically generating a test program to test cache coherency in the computing environment, where the computing environment includes at least one processing unit. The deterministically generating includes producing cache state test sequences using graph traversal, where the cache state test sequences include closed paths of cache-affecting operations, and where using graph traversal includes traversing one or more state graphs with nodes representing cache states and connecting edges representing operations producing respective cache state transitions in the at least one processing unit. Further, the deterministically generating includes pruning the cache state test sequences, using closed-path graph analysis, to generate the test program, where the test program has a selected cache state coherence test coverage using chosen cache state test sequences obtained from pruning the cache state test sequences. Further, deterministically generating the test program includes generating a weighted multigraph to facilitate producing the cache state test sequences using graph traversal, where the one or more state graphs include the weighted multigraph, and where the connecting edges of the weighted multigraph further include weight priorities used in the pruning of the cache state test sequences. In one or more embodiments, the deterministically generating the test program is for at least one cache zone of the at least one processing unit for testing cache coherency of the at least one cache zone, where a cache zone can be defined by two or more caches which can cause unique state transitions within the computing environment. Further, the method includes initiating executing of the test program in the computing environment to test the cache coherency. Advantageously, the method facilitates processing within the computing environment by testing the cache coherency of the environment, and more particularly, enhances cache coherency testing within the computing environment. By deterministically generating the test program to test cache coherency in the computing environment, faster, more efficient, and less costly (in the sense of compute resource requirements) cache coherency testing is provided. A graph-based approach is presented to producing cache state test sequences using closed paths of cache-affecting operations in one or more state graphs. Pruning the cache state test sequences results in a unique set of cache state test sequences or transitions, which have a selected cache coherency test coverage. In one or more embodiments, an optimum set of chosen cache state test sequences is obtained for a selected cache coherence test coverage. By pruning the produced cache state test sequences to arrive at the test program, the length of the test program, processing time of the test program and number of unique test programs required are reduced. Further, deterministically generating the test program using a weighted multigraph facilitates producing the cache state test sequences using graph traversal, and the weight priorities facilitate pruning the state test sequences to, for instance, avoid duplicate cache state transitions, and facilitate arriving at a unique set of transitions that can cause multiple state transitions in the computing environment in the order of priority to include in the test program for testing the cache coherency. Further, by tailoring the process to at least one cache zone of interest, the process is dependent on the scope of the particular state transitions to be achieved. For instance, if the cache state transitions to be achieved are of a local scope only (e.g., within a multicore processor), then the cache zone cluster can contain random processing units (such as threads or cores) within that multicore processor. However, if a global scope of cache state transitions is desired, then the cache zone cluster can include, for instance, processing units (such as threads, cores or processors) across multiple multicore processors, in one embodiment.

In another embodiment, the computing environment includes multiple processing units, the at least one processing unit being at least one processing unit of the multiple processing units, and generating the weighted multigraph includes assigning the weight priorities to the connecting edges of the weighted multigraph, where the assigning includes assigning higher weight priority to cache state transitions which can be reached via interaction between processing units of multiple processing units in order to process those cache state transitions before other cache state transitions of the weighted multigraph in obtaining the chosen cache state test sequences of the test program. Advantageously, assigning weight priorities to the connecting edges of the weighted multigraph facilitates prioritizing certain cache state transitions in arriving at the chosen cache state test sequences, which allows, for instance, the selected cache coherence test coverage to be obtained using a minimum number of test sequences, or which allows a coherence test coverage to be obtained which is deemed desirable based on previous generation processors or complexity of the computing environment. In another embodiment, priority can be assigned based on the state space being created, for instance, to prioritize testing of a new state or transition within the computing environment.

In a further embodiment, generating the weighted multigraph includes generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processing units causes a cache state transition in another processing unit of the multiple processing units. Generating one or more forest of dependency graphs facilitates pruning the cache state test sequences to avoid duplicate cache state transitions, identifying cache state transitions required in other processing units to cause desired transitions, and to facilitate generating a unique set of chosen cache state test sequences for the test program that provides a selected cache coherence coverage.

In another embodiment, the computer-implemented method further includes identifying the closed paths of cache-affecting operations from the weighted multigraph, where the pruning of the cache state test sequences further includes determining a total weight of each closed path of cache-affecting operations of the cache state test sequences and processing the identified closed paths in descending order of the determined total weights in generating the test program. Identifying the closed paths of cache-affecting operations from the weighted multigraph facilitates producing the cache state test sequences, and determining the total weight of each closed path of cache-affecting operations in the cache state test sequences allows higher priority cache state test sequences, or closed paths, to be considered first for inclusion in the test program, thereby increasing the likelihood that the higher priority transitions are included in the resultant test program.

In another embodiment, processing the identified closed paths includes, for a selected closed path of the identified closed paths, identifying any secondary transitions of the selected closed path in the other processing unit, and using graph coloring processing to facilitate reprioritizing a processing order of the identified closed paths, where the graph coloring processing produces a graph with nodes representing closed paths and connecting edges representing secondary paths generated as a result of the closed paths. Advantageously, graph coloring processing facilitates pruning the cache state test sequences to arrive at the test program with the selected cache coherence test coverage, where the test program includes a unique set of cache state transitions for testing cache coherency. Reprioritizing the processing order of the identified closed paths in association with graph coloring processing facilitates choosing a unique set of cache state test sequences for the test program which provide the selected cache coherence test coverage, and facilitate providing an optimum set of transitions for a desired cache coherency coverage.

In one or more embodiments, the selected cache coherence test coverage ensures that executing the test program generates all desired cache state transitions in the computing environment for testing the cache coherency. Advantageously, a test program is generated deterministically, with the desired cache state transitions for testing cache coherency within the computing environment. In one or more embodiments, the selected cache coherence test coverage is an optimal cache coherence test coverage for the at least one processing unit, with a minimum number of cache state test sequences or cache state transitions being included, thereby providing a more efficient and less costly cache coherency test process.

In one or more other aspects, disclosed herein a method, computer system and computer program product for facilitating processing within a computing environment including, for instance, for validating a cache coherency protocol of the computing environment by covering every possible (i.e., legal) cache state transition in the computing environment deterministically using graph-based analysis. In one or more embodiments, the process includes: constructing a graph containing one node per cache state and one edge per possible cache state transition, with each edge being labeled with an action or transaction causing the transition, and a weight (i.e., priority); constructing a forest of dependency graphs to represent all secondary transitions achieved in, for instance, neighboring cores (or more generally, neighboring processing units) as a consequence of a primary transition in a target core; assigning priority to edges based on transitions which cause secondary transitions in other cores; searching the graph(s) to identify closed paths; determining the weight of each closed path (e.g., as the sum of the weights on the edges in the path); sorting the closed paths in descending order of weight; using graph coloring processing, ranking the closed paths to reduce the number of edges in the path in order to reduce the length of the final test program; and using cache zone clustering depending on the scope of the state transitions to be achieved, such as pairing processing units (e.g., threads, cores, nodes, or processors), and creating clusters where transitions are to be caused to create random state transitions. Advantageously, a deterministic methodology is disclosed herein to generate cache state sequences, such as all possible cache state sequences (local and/or remote), and then optimize the number of sequences to provide a minimum number of operations needed to cover all state transitions. The disclosed deterministic process uses graph traversal to determine closed paths, and then, in one or more embodiments, forest of dependency graphs, prioritization of edges, graph coloring and/or cache zone clustering, to arrive at a unique set of transitions for validating a cache coherency protocol. In one or more embodiments, the cache state transition sequence generation process can be used in a post-silicon validation environment for testing the cache state protocol. Advantageously, the disclosed process is a dimension-independent, deterministic state transition generation methodology to determine cache state test sequences, and then optimize the number of sequences to provide, for instance, the minimum number of operations needed to cover the desired state transitions.

Aspects of the present disclosure and certain features, advantages, and details thereof, are explained more fully below with reference to the non-limiting example(s) illustrated in the accompanying drawings. Descriptions of well-known systems, devices, processing techniques, etc., are omitted so as not to unnecessarily obscure the disclosure in detail. It should be understood, however, that the detailed description and the specific example(s), while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, where the same or similar reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application of the concepts disclosed.

Note also that illustrative embodiments are described below using specific code, designs, architectures, protocols, layouts, schematics, systems, or tools only as examples, and not by way of limitation. Furthermore, the illustrative embodiments are described in certain instances using particular software, hardware, tools, and/or data processing environments only as example for clarity of description. The illustrative embodiments can be used in conjunction with other comparable or similarly purposed structures, systems, applications, architectures, etc. One or more aspects of an illustrative control embodiment can be implemented in software, hardware, or a combination thereof.

As understood by one skilled in the art, program code, as referred to in this application, can include software and/or hardware. For example, program code in certain embodiments of the present disclosure can utilize a software-based implementation of the functions described, while other embodiments can include fixed function hardware. Certain embodiments combine both types of program code. Examples of program code, also referred to as one or more programs, are depicted in FIG. 1, including operating system 122 and cache coherency test module 200, which are stored in persistent storage 113.

One or more aspects of the present disclosure are incorporated in, performed and/or used by a computing environment. As examples, the computing environment can be of various architectures and of various types, including, but not limited to: personal computing, client-server, distributed, virtual, emulated, partitioned, non-partitioned, cloud-based, quantum, grid, time-sharing, clustered, peer-to-peer, mobile, having one node or multiple nodes, having one processor or multiple processors, and/or any other type of environment and/or configuration, etc., that is capable of executing a process (or multiple processes) that, e.g., perform relational database migration processing, such as disclosed herein. Aspects of the present disclosure are not limited to a particular architecture or environment.

Prior to further describing detailed embodiments of the present disclosure, an example of a computing environment to include and/or use one or more aspects of the present disclosure is discussed below with reference to FIG. 1.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as cache coherency test module block 200. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

Communication fabric 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 200 typically includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101) and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The computing environment described above is only one example of a computing environment to incorporate, perform and/or use one or more aspects of the present disclosure. Other examples are possible. Further, in one or more embodiments, one or more of the components/modules of FIG. 1 need not be included in the computing environment and/or are not used for one or more aspects of the present disclosure. Further, in one or more embodiments, additional and/or other components/modules can be used. Other variations are possible.

Figure 2:
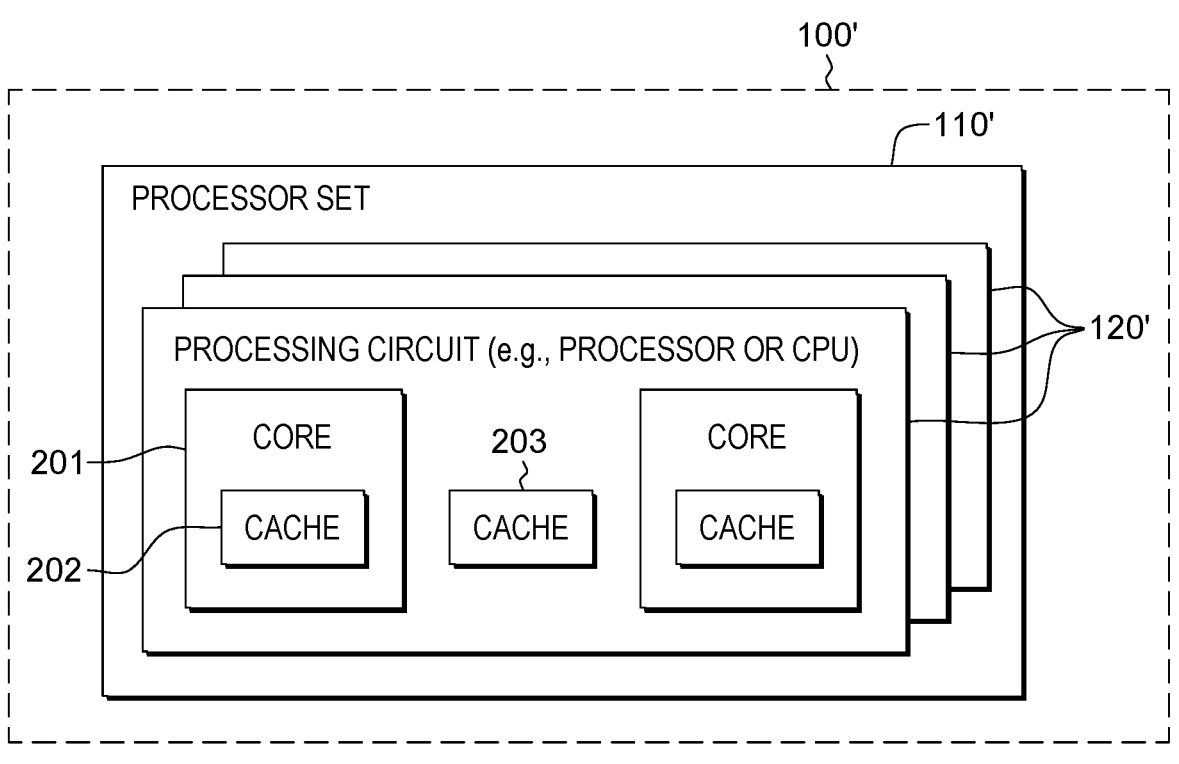
FIG. 2 depicts one embodiment of a processor set with one or more multicore processing circuits to include and/or use one or more aspects of the present disclosure.

By way of further example, FIG. 2 depicts another embodiment of a computing environment 100' similar to computing environment 100 described above in connection with FIG. 1. In computing environment 100', a processor set 110' is provided, which includes multiple processing circuits 120', such as multiple processors or multiple central processing units (CPUs). Processing circuits 120' can be distributed over multiple packages, for instance, multiple coordinated integrated circuit chips. In the embodiment of FIG. 2, each processing circuit 120' has multiple processor cores 201, with two processor cores being shown by way of example only. Each processing circuit 120' includes, by way of example, cache 202 located within cores 201, and cache 203, such as a shared cache, located external to cores 201. In one or more embodiments, cache 202, 203 can be memory located within the processor chip package(s) used for data or code that should be available for rapid access by the threads or cores running on processor set 110'. Cache members are typically organized in multiple levels, depending upon relative proximity to the processing circuitry, such as to the respective core 201. For instance, in an 8-core processor chip package with three cache levels, an L1 cache may be provided within each core, one intermediate L2 cache for each pair of cores, and one L3 cache can be provided, shared between all 8 cores.

Figure 3C:
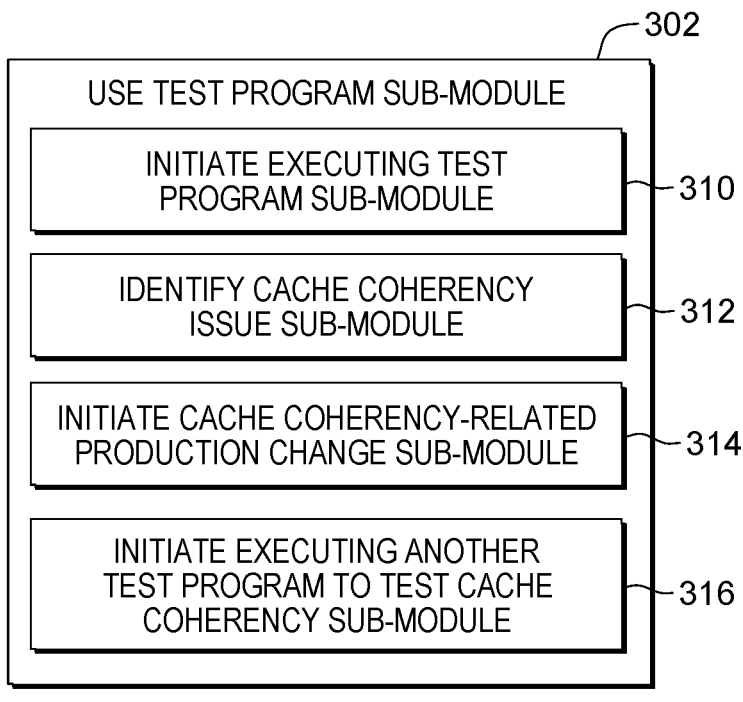
FIG. 3C depicts one embodiment of a computer program product with a use test program sub-module, in accordance with one or more aspects of the present disclosure.
Figure 4:
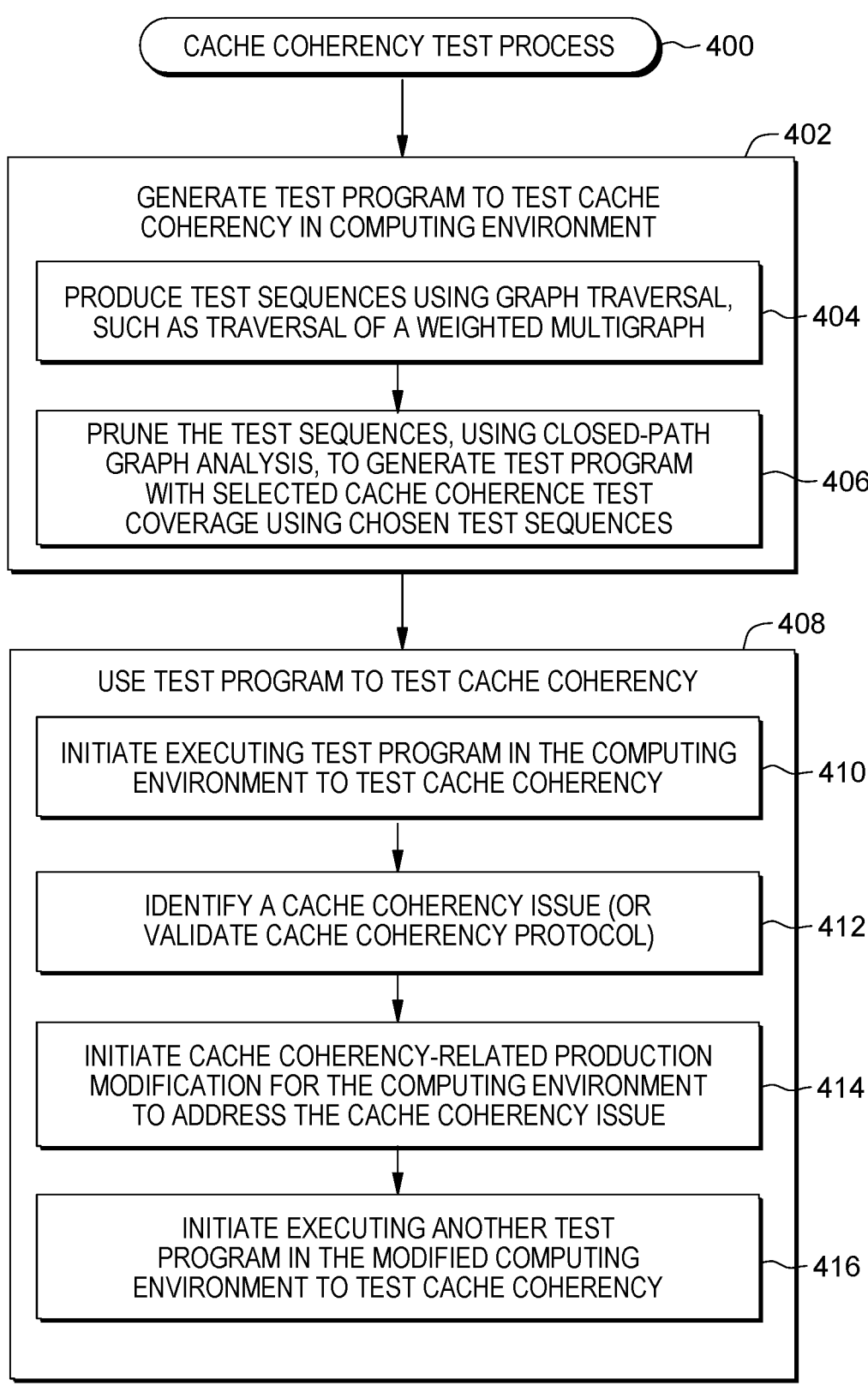
FIG. 4 depicts one embodiment of a cache coherency test process, in accordance with one or more aspects of the present disclosure.

By way of example, one or more embodiments of a cache coherency test module and process are described initially with reference to FIGS. 3A-4. FIGS. 3A-3C depict one embodiment of cache coherency test module 200 that includes code or instructions to perform cache coherency test processing, in accordance with one or more aspects of the present disclosure, and FIG. 4 depicts one embodiment of a cache coherency test process, in accordance with one or more aspects of the present disclosure.

Referring to FIGS. 1-3C, cache coherency test module 200 includes, in one example, various sub-modules used to perform processing, in accordance with one or more aspects of the present disclosure. The sub-modules are, e.g., computer-readable program code (e.g., instructions) and computer-readable media (e.g., persistent storage (e.g., persistent storage 113, such as a disk) and/or a cache (e.g., cache 121 (FIG. 1), 202, 203 (FIG. 2)), as examples). The computer-readable media can be part of a computer program product and can be executed by and/or using one or more computers, such as computer(s) 101; processors, such as a processor of processor set 110 (FIG. 1) or 110' (FIG. 2); and/or processing circuitry, such as processing circuitry of processor set 110 (FIG. 1) or 110' (FIG. 2), etc.

As noted, FIGS. 3A-3C depict one embodiment of a cache coherency test module 200 which, in one or more embodiments, includes, or facilitates, cache coherency test processing in accordance with one or more aspects of the present disclosure. In the embodiment of FIG. 3A, example sub-modules of cache coherency test module 200 include a generate test program sub-module 300 to deterministically generate a test program to test cache coherency in a computing environment, where the computing environment includes at least one processing unit (such as at least one thread, core, or processing circuit, such as depicted (for example) in FIGS. 1-2). As depicted in FIG. 3B, generate test program sub-module 300 can include, in one or more embodiments, a produce test sequences sub-module 304 to facilitate producing cache state test sequences (or macro sequences) using graph traversal, where the cache state test sequences include closed paths of cache-affecting operations, and using graph traversal includes traversing one or more state graphs with nodes representing cache states and connecting edges representing operations producing respective cache state transitions at the at least one processing unit. In addition, generate test program sub-module 300 includes, in one or more embodiments, a prune test sequences to generate test program sub-module 306 to, for instance, prune the cache state test sequences using closed-path graph analysis to generate the test program, where the test program has a selected cache coherence test coverage using chosen cache state test sequences obtained from pruning the cache state test sequences. In one or more embodiments, the test program can be generated as an optimized test program having a maximum cache coherence test coverage with a minimum number of test sequences, by way of example only. Further, in one or more embodiments, the test program includes, for instance, randomly generated testcases for the chosen cache state test sequences.

As illustrated in FIG. 3A, cache coherency test module 200 further includes, in one or more embodiments, a use test program sub-module 302 to, for instance, initiate executing of the test program in the computing environment to test/validate cache coherency. In one or more embodiments, the generated test program is executed to test a cache coherency protocol in the computing environment. By way of example, FIG. 3C depicts one embodiment of use test program sub-module 302 which, as noted, can include an initiate executing test program sub-module 310 to initiate executing of the test program in the computing environment to test cache coherency, such as described herein. In addition, in one or more embodiments, use test program sub-module 302 includes an identify cache coherence issue sub-module 312 to identify a cache coherency defect, error, or other potential cache coherency issue, and an initiate cache coherence-related production change sub-module 314 to initiate, for instance, a change to the computing environment to enhance cache synchronization by, for instance, improving the rate at which cache data is updated (e.g., reducing latency of data transfer), or otherwise improve the cache coherency protocol of the computing environment to address the identified cache coherency issue. In one or more embodiments, the initiate cache coherency-related production change sub-module 314 is configured to initiate one or more changes within the computing environment to, for instance, enhance uniformity of shared data within the applicable caches of the computing environment. In one or more embodiments, use test program sub-module 302 further includes an initiate executing another test program to test cache coherency sub-module 316 to, for instance, evaluate cache coherency in the modified computing environment to determine whether the previously identified cache coherency issue has been addressed. Note that, in one or more embodiments, the other test program can be the same test program deterministically generated as described herein, which was used to identify the coherency issue, or another test program, such as one subsequently generated using the cache coherency test processing described herein, or another approach to test program generation.

Advantageously, improved processing within a computing environment is disclosed herein by, for instance, enhancing cache coherency testing within the computing environment. In one embodiment, the process includes deterministically generating a test program to test cache coherency in the computing environment. By generating the test program deterministically, or in a planned way, the test program can be generated with a selected cache coherence test coverage using a set of chosen cache state test sequences. For instance, the test program can be generated with a selected cache coherence test coverage using chosen cache state test sequences obtained from pruning test sequences produced using graph traversal, with the cache state test sequences including closed paths of cache-affecting operations identified via weighted multigraph traversal, where nodes in the group represent cache states and connecting edges represent operations producing respective cache state transitions for at least one processing unit of the computing environment. In one or more embodiments, the selected cache coherence test coverage ensures that executing the test program generates all desired cache state transitions in the computing environment for testing cache coherency, for instance, for testing cache coherency in one or more cache zones or clusters of the cache zones in the computing environment (such as within a selected multicore processor (local), or between selected multicore processors (global)). In one or more embodiments, the test program is deterministically generated as an optimized test program having a maximum cache coherence test coverage using a minimum number of cache state test sequences.

Note that although various sub-modules are described herein, cache coherency test module processing, such as disclosed can use, or include, additional, fewer, and/or different sub-modules. A particular sub-module can include additional code, including code of other sub-modules, or less code. Further, additional and/or other sub-modules can be used. Many variations are possible.

In one or more embodiments, the sub-modules are used, in accordance with one or more aspects of the present disclosure, to perform cache coherency test processing. FIG. 4 depicts one example of a cache coherency test process 400, such as disclosed herein. The process is executed, in one or more examples, by a computer (e.g., computer 101 (FIG. 1)), and/or a processor or processing circuitry (e.g., of processor set 110 of FIG. 1 or processor set 110' of FIG. 2). In one example, code or instructions implementing the process, are part of a module, such as cache coherency test module 200. In other examples, the code can be included in one or more other modules and/or in one or more sub-modules of the one or more other modules. Various options are available.

As one example, cache coherency test process 400 executing on a computer (e.g., computer 101 of FIG. 1), a processor (e.g., a processor of processor set 110 of FIG. 1 or processor set 110' of FIG. 2), and/or processing circuitry (e.g., processing circuitry of processor set 110 or processor set 110'), deterministically generates a test program to test cache coherency in a computing environment 402. In one or more embodiments, the computing environment includes at least one processing unit and associated cache. As illustrated in FIG. 4, in one or more embodiments, generating the test program to test cache coherency includes, for instance, producing cache state test sequences using graph traversal, such as traversal of a weighted multigraph 404. In one or more embodiments, the cache state test sequences include closed paths of cache-affecting operations, and using graph traversal includes traversing one or more state graphs, such as a weighted multigraph described herein, with nodes representing cache states and connecting edges representing operations producing respective cache state transitions for the at least one processing unit.

In one or more embodiments, cache coherency test process 400 further includes using the test program to test cache coherency 408. Using the test program to test cache coherency 408 includes, in one or more embodiments, initiating executing of the test program in the computing environment to test cache coherency 410, and identifying a cache coherency issue based on executing of the test program (that is, as part of validating the cache coherency protocol of the computing environment) 412. Where a cache coherency issue is identified, the process further includes, in one or more embodiments, initiating a cache coherency-related production modification for the computing environment to address the cache coherency issue 414. For instance, a cache coherency-related production modification for the computing environment can be a change or modification to the computing environment to enhance cache synchronization by, for instance, improving the rate at which cache data is updated (e.g., reducing latency of data transfer), or otherwise improving the cache coherency protocol of the computing environment to address the identified cache coherency issue. In one or more embodiments, the initiate cache coherency-related production change initiates one or more changes within the computing environment to, for instance, enhance uniformity of shared data within the applicable caches of the computing environment, and in doing so, address the identified cache related issue.

In one or more embodiments, the process further includes initiating executing of another test program in the modified computing environment to test cache coherency of the modified computing environment 416. In one or more embodiments, the other test program can be the same test program already deterministically generated, and used previously to test cache coherency within the computing environment, or can be another test program, such as another test program generated as described as herein, or generated using one or more other approaches.

As noted, cache coherency refers to uniformity of data across caches of a computing environment, such as within a multiprocessor environment. If each processor has a cache that reflects the state of various parts of memory, it is possible that two or more caches may have copies of the same line. It is also possible that a given line may contain more than one data item. If two cores (or threads) make appropriately serialized changes to those data items, then the result could be that two or more caches end up with different, incorrect versions of the line of memory. In other words, the system's data is no longer coherent because the system contains two or more different versions of a specific area of memory.

The solutions to enhancing cache coherency typically include invalidating all but one of the duplicate lines when the line is modified. Hardware can use snooping logic to invalidate a cache line, without any software intervention. However, any processor whose cache line has been invalidated will have a cache-miss, with its accompanying delay, the next time that the line is addressed. Snooping is the logic used to resolve the problem of cache consistency. For instance, snooping logic typically broadcasts a message over a bus each time a word in its cache has been modified. The snooping logic also snoops on the bus looking for such messages from other processors. When a process detects that another processor has changed the value at an address existing in its own cache, the snooping logic invalidates that entry in its cache. This is referred to a cross-invalidate. Cross-invalidate reminds the processor that the value in the cache is not valid, and it must look for the correct value elsewhere (e.g., in memory or another cache).

The objective of a cache coherency protocol is to load recently used local data into the appropriate caches, and maintain the data through a number of read and write operations, while using the protocol to maintain consistency of shared data that might be in other caches at the same time. A number of different cache coherency protocols can be used in a multiprocessor system to maintain cache coherency, such as the shared invalid (SI) protocol, modified shared invalid (MSI), modified exclusive shared (MES) protocol, modified exclusive shared invalid (MESI) protocol, modified owned shared invalid (MOSI) protocol, modified owned exclusive shared invalid (MOESI) protocol, recent tagged modified exclusive shared invalid (RT MESI), etc. For many computing environments, including multiprocessor environments, the functional validation of a cache coherency protocol within the computing environment can be a challenge during testing. In view of the growing number of cache states with each generation of processor, disclosed herein is a deterministic approach to generate, for instance, all possible cache state transitions, using a minimum number of test operations to validate cache coherency, or to identify a cache coherency issue to be addressed. For instance, recent server processors can have ten or more cache states and about fifty valid cache state transitions.

FIG. 5 illustrates one example of a data structure with cache states and transitions between cache states of a computing environment. In the data structure, the cache states depicted include invalid cache states I, I2, shared states S, S2, tagged states T, T2, T4, and modified states M, M2, M3, by way of example only. Possible transitions are indicated by a 1 in the data structure. Note with respect to FIG. 5, that a primary cache state transition occurs when a cache state changes from one state to another state in, for instance, a core due to an operation performed in that core. A secondary state transition occurs in one core due to an operation performed in another core, or another cache. The operations causing cache state transition can be simple, such as a read or write, or composite, such as a self-read followed by another-core-read, as understood in the art.

Figure 6:
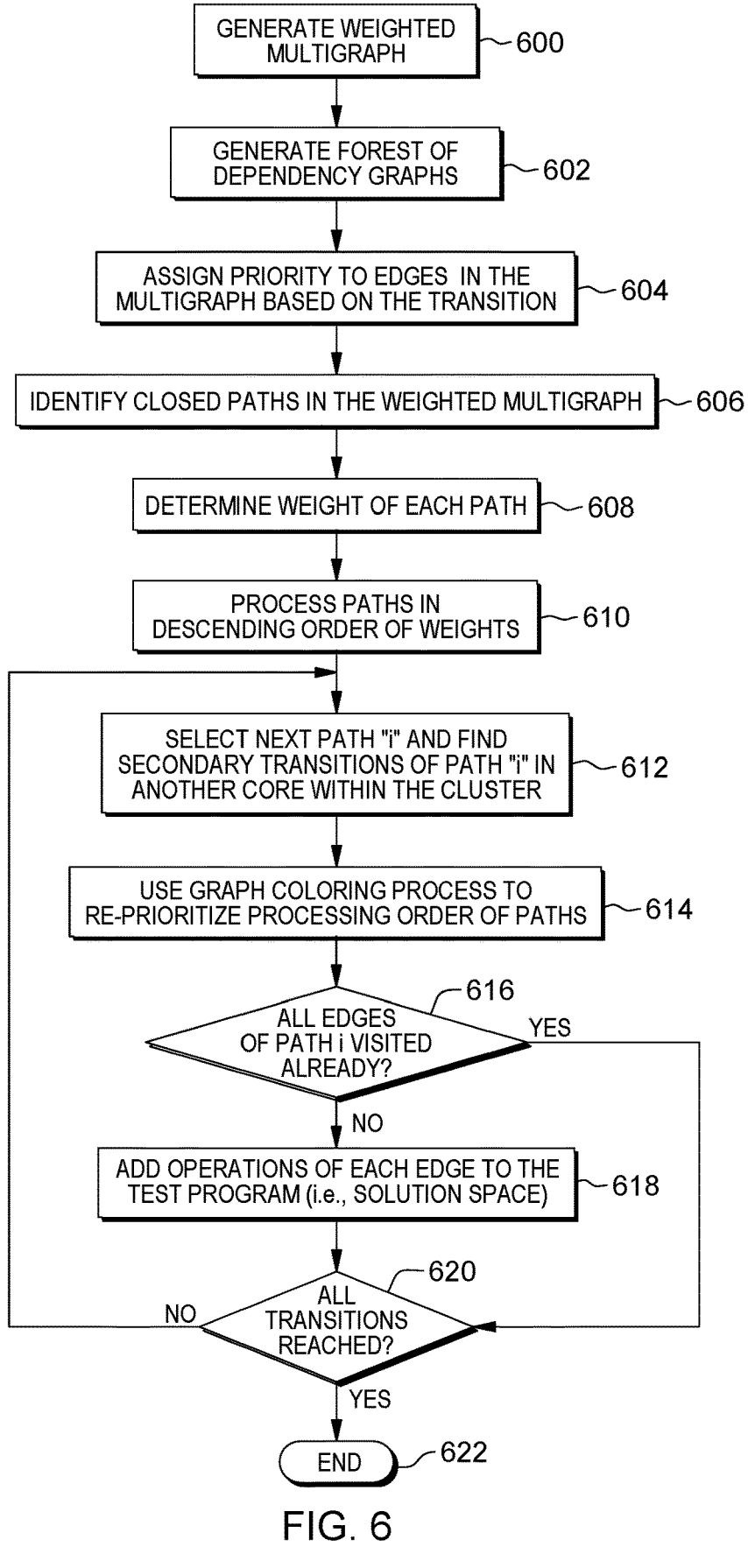
FIG. 6 depicts one embodiment of a deterministic workflow for generating a test program with a selected cache coherence test coverage, in accordance with one or more aspects of the present disclosure.
Figure 7A:
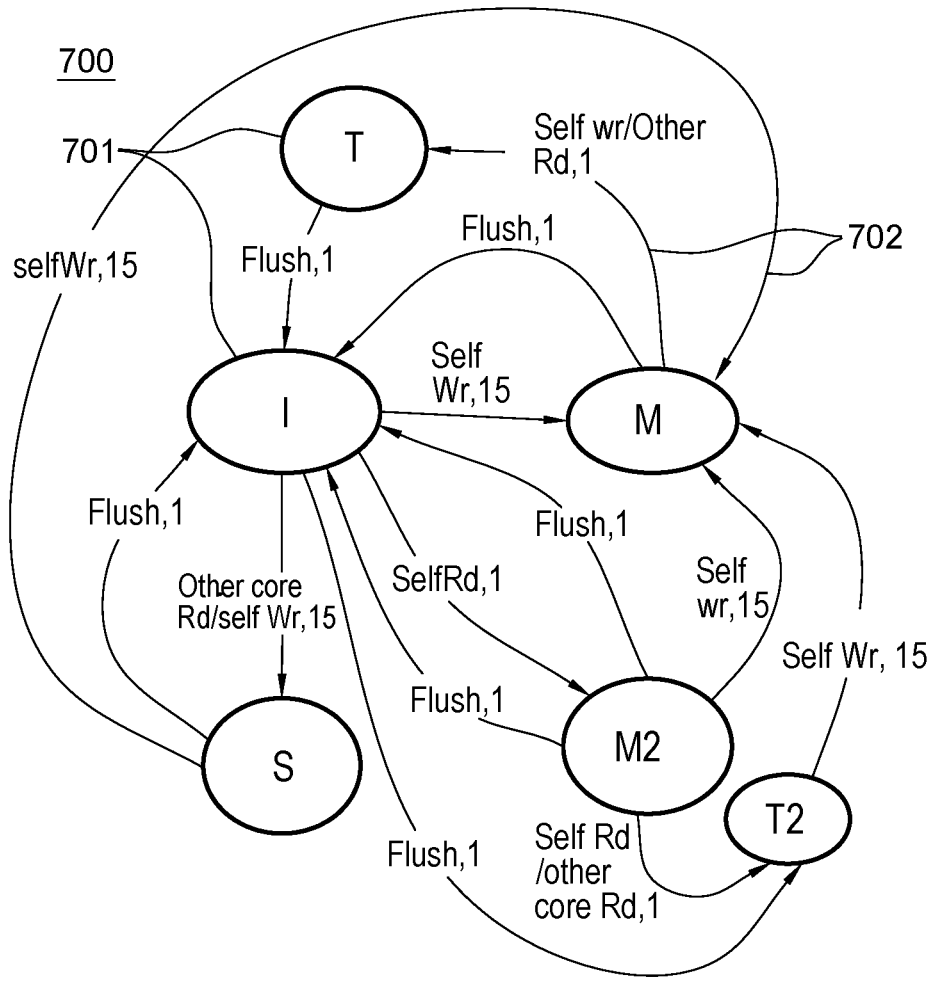
FIG. 7A depicts one embodiment of a state transition weighted multigraph, in accordance with one or more aspects of the present disclosure.

FIG. 6 illustrates another embodiment of a deterministic workflow for generating a test program with selected cache coherence test coverage, in accordance with one or more aspects of the present disclosure. As illustrated, the workflow includes generating a weighted multigraph 600. By way of example, FIGS. 7A-7B respectively illustrate one embodiment of a state transition weighted multigraph and an associated data structure (i.e., adjacency matrix). As illustrated in FIG. 7A, the vertices of the weighted multigraph indicate cache states, which in this example, include invalid (I), modified (M, M2), shared (S1), and tagged (T, T2) states. In the weighted multigraph example of FIGS. 7A & 7B, there can be greater than one edge between two vertices, with the edges indicating transactions needed to initiate the transition, and priority of the edge. The transactions or operations can include, by way of example, a self-read and/or self-write, which are single-core operations, as well as multicore operations, such as flush, self-read followed by other core-read, other core-write followed by a self-read, self-write followed by other-core-read. In one or more embodiments, the priorities assigned to the edges are used to reduce the total number of cache state test sequences needed to cover the cache state space. Assigning a higher priority to those transitions which can be reached via interaction between cores, and processing those transitions earlier than other transitions, assists in avoiding duplicate transitions in the resultant test program. In the example of FIGS. 7A-7B, the higher priority of 15 is assigned to those transitions which can be reached via interaction between cores, and the lower priority of 1 is assigned to those transitions which are not reached via interaction between cores.

Figure 8B:
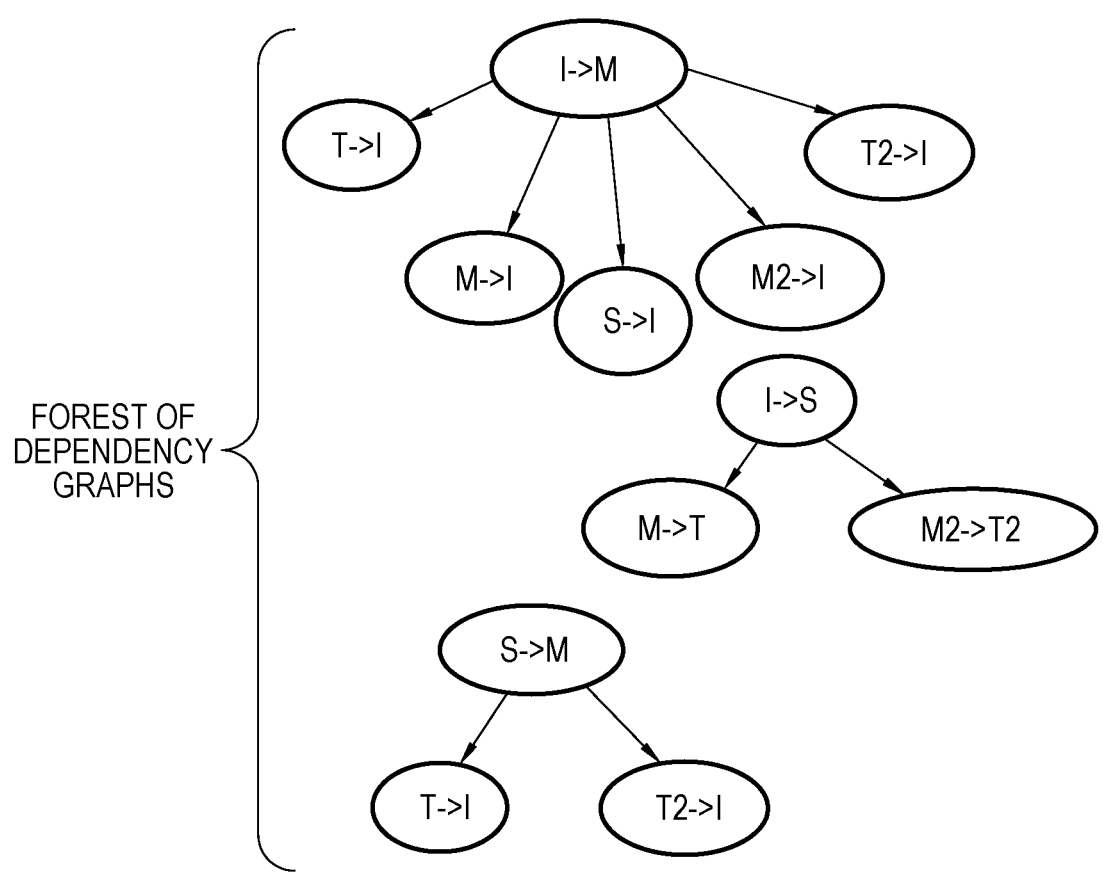
FIG. 8B depicts one embodiment of forest of dependency graphs obtained from the exemplary data structure of FIG. 8A, in accordance with one or more aspects of the present disclosure.

Returning to the deterministic workflow embodiment of FIG. 6, the process also includes generating forest of dependency graphs 602 to indicate the secondary transitions caused in other processing units (e.g., other cores) due to a transition initiated in a particular processing unit (e.g., a particular core). As an example, FIG. 8A depicts one embodiment of a data structure indicating whether a cache state transition in one core of a computing environment causes a cache state transition in another core, and FIG. 8B depicts one embodiment of forest of dependency graphs obtained from the exemplary data structure of FIG. 8A. Returning to the deterministic workflow of FIG. 6, the forest of dependency graphs can be used to facilitate assigning the priorities to the edges in the multigraph to obtain the weighted multigraph based on the transitions 604. As noted, an exemplary state transition weighted multigraph and adjacency matrix are illustrated in FIGS. 7A-7B, by way of example only.

Figure 9A:
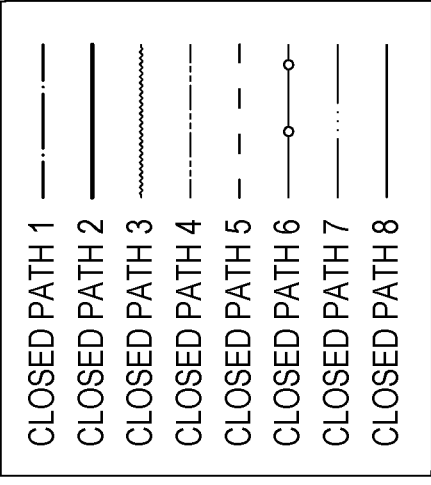
FIG. 9A illustrates one example of detected closed paths within the weighted multigraph embodiment of FIGS. 7A-7B, in accordance with one or more aspects of the present disclosure.
Figure 9A:
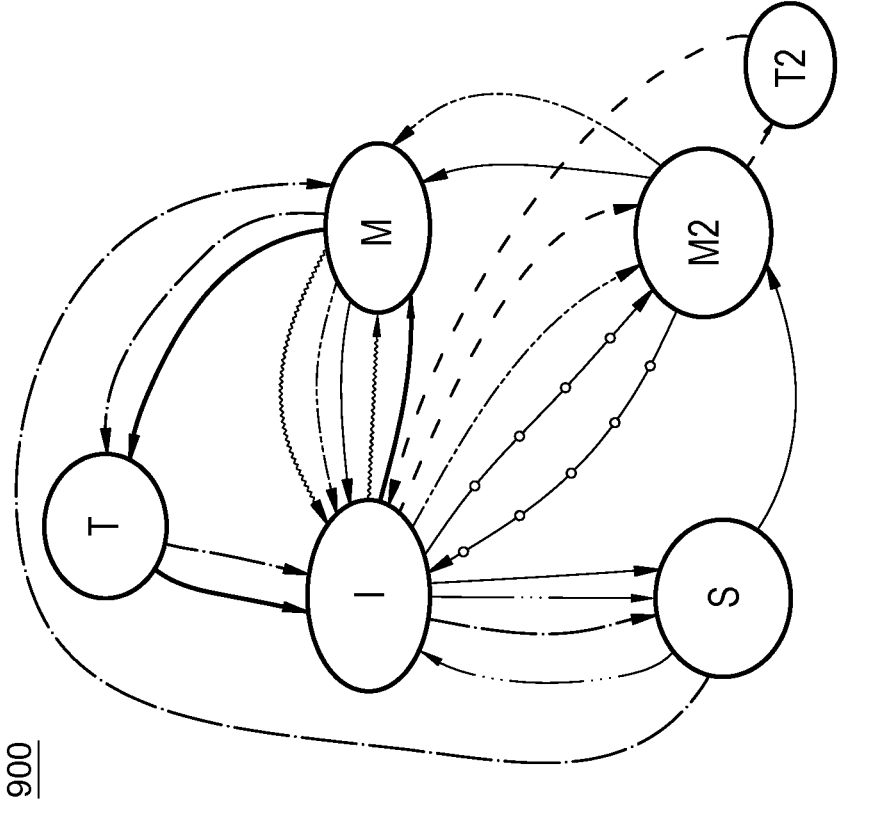
Figure 9B:
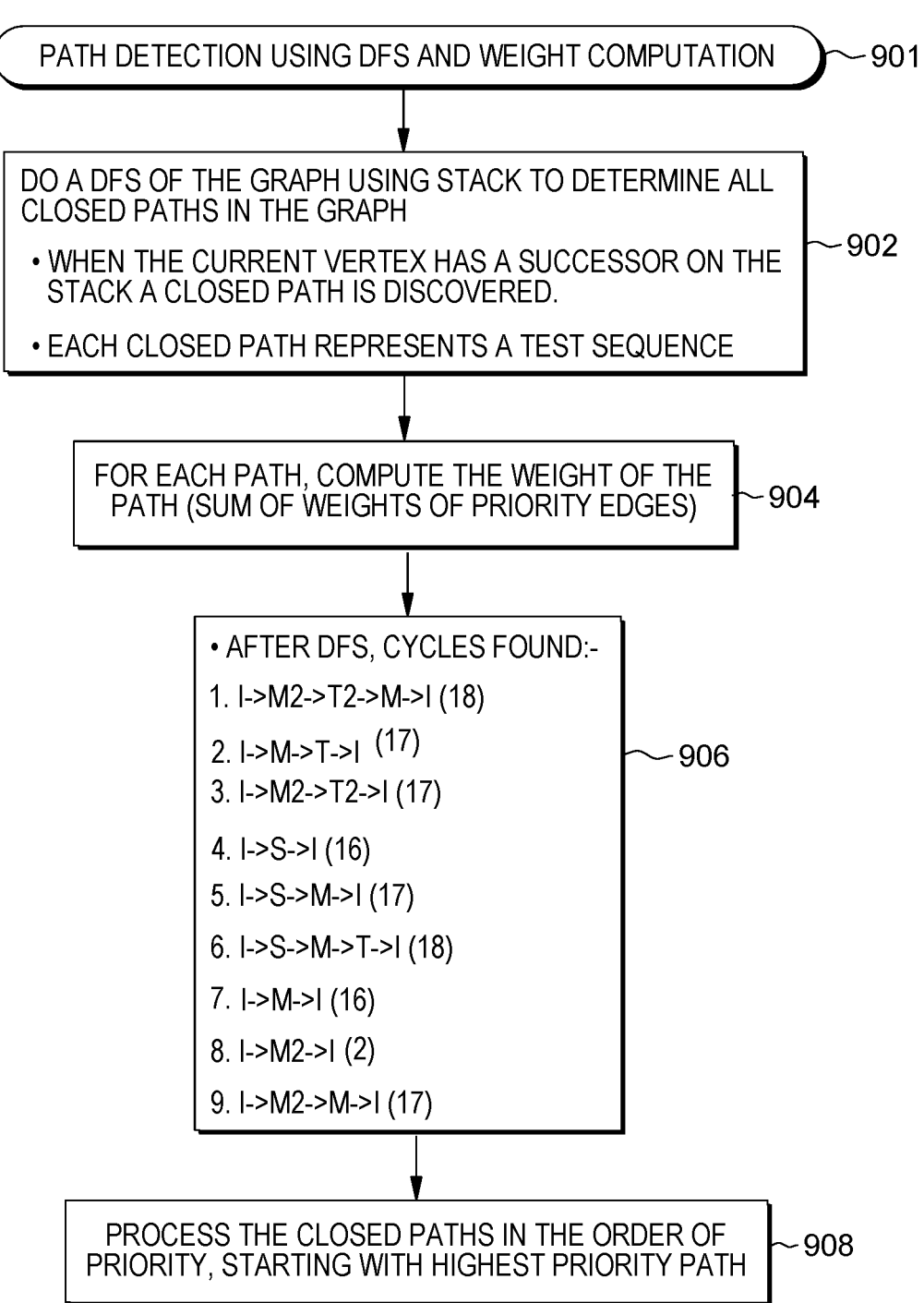
FIG. 9B depicts one embodiment of closed-path detection processing using a depth-first search and total weight determination in evaluating test sequences for the test program, in accordance with one or more aspects of the present disclosure.

As illustrated in FIG. 6, the deterministic workflow embodiment further includes identifying closed paths in the weighted multigraph 606, determining a weight of each closed path 608, and processing the closed paths in descending order of weights 610. FIG. 9A illustrates one example of detected closed paths within the weighted multigraph embodiment of FIGS. 7A-7B, and FIG. 9B illustrates the noted closed-path processing using a depth-first search and total weight determination in evaluating the closed paths or cache state test sequences for inclusion in the resultant test program, in accordance with one or more aspects of the present disclosure. Note that as used herein, a closed path refers to a path which has the same starting and ending state, and there are more than two unique states in the path.

As illustrated in the workflow embodiment of FIG. 9B, the closed-path detection using depth-first search and weight computation 901 can include doing a depth-first search of the weighted multigraph using a stack to determine all closed paths in the graph 902. Whenever a current vertex in the graph has a successor on the stack, a closed path is discovered or determined, and each closed path or cycle represents a cache state test sequence. For each closed path, the weight of the closed path, that is, the sum of the weights of the priority edges of the closed path, is determined 904. An example of the determined closed paths or cycle weights 906 is illustrated in FIG. 9B. The closed paths are then processed in order of priority, starting with the highest-priority path 908. By identifying closed paths in the graph, after every sequence is completed, a next sequence can be started from the reset state. The depth-first search approach is used so that before an initial state is reached, a maximum number of cache state transactions is covered, which can reduce the number of redundant cache state test sequences using the deterministic process disclosed.

Returning to FIG. 6, the deterministic workflow embodiment illustrated further includes selecting a next path "i", and finding secondary transitions of path "i" in another core within the cluster (e.g., processor or CPU) 612. Graph coloring can be used to reprioritize the processing order of the paths for the selected next path 614, and processing determines whether all edges of path "i" have been visited by the processing 616. If "no", then one or more operations of each edge that have yet to be visited are added to the test sequence (i.e., the solution space) 618. Assuming that all edges of path "i" have already been visited, or after one or more operations for each unvisited edge have been added, then processing determines whether all cache state transitions have been reached 620. If "no", then the deterministic workflow returns to select a next path "i", and finds secondary transitions of path "i" in another core within the cluster 612. Otherwise, once all cache state transitions have been reached, then the test program is complete for the selected cache coherence test coverage using the chosen cache state test sequences 622.

Figures 10A, 10B:
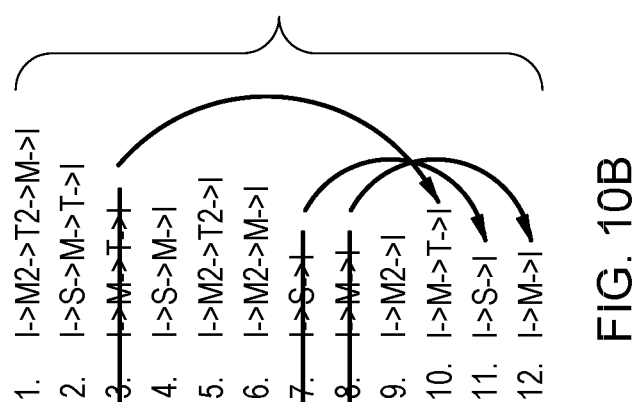
FIG. 10A depicts one embodiment of a graph coloring process to facilitate adjusting priorities of the detected closed paths, in accordance with one or more aspects of the present disclosure.
FIG. 10B is an example of pruning test sequences, using closed-path graph analysis, to deterministically generate the test program, in accordance with one or more aspects of the present disclosure.

As noted, in one or more embodiments, graph coloring processing can be used to facilitate identifying the unique closed paths or cache state test sequences to be included in the final test program based on an imposed constraint. FIG. 10A depicts one embodiment of a graph coloring process to facilitate adjusting priorities of detected closed paths, and FIG. 10B is an example of pruning test sequences, using closed-path graph analysis to deterministically generate the test program, in accordance with one or more aspects of the present disclosure. As illustrated in FIG. 10A, each vertex represents a cache state test sequence or cycle in the graph coloring process, and when two test sequences have the property that executing a loop or test sequence of transactions on one core causes a secondary loop or test sequence in another core, that property is modeled on the graph as an edge between the two vertices. Thus, no two vertices connected by an edge are colored the same. This is equivalent to saying that only one of the loops or cache state test sequences needs to be added to the solution space (e.g., test program). This process is repeated to identify all unique cycles or cache state test sequences. Depending on the "color" assigned, the sequences are reprioritized in the deterministic workflow embodiment of FIG. 6, as noted above. Here, the sequence IMTI and ISI are reprioritized, since they are duplicate sequences, as shown in FIG. 10B. As illustrated in FIG. 10B, the identified sequences are moved down in the stack of cache state test sequences to be considered by the process, for instance, to the bottom of the stack, in one example only.

As noted, for each loop or closed path, a macro sequence (or cache state test sequence) is generated if at least one edge of the loop is unvisited. The transactions corresponding to each edge in the closed path or loop can be added to form the test sequence. By way of example, the following code can be used to identify unique closed paths and generate the macro sequence:

```
For each cycle,
    For each edge, vi → vj
        If op[i][j] == "VISITED", visited++;
            Pick the corresponding op from a [i][j] to be inserted into test sequence.
            if (visited ! = number of edges in the cycle)
                insert the test sequence into the test program (testcase)
                Update op[i][j] = "VISITED"
            For each core c in the group,
                if dependency matrix shows a
    vertex vk → vl, such that there is an edge from vertex vi → vj to vk → vl
                Update its output test sequence op[k][l] = "VISITED"
    Repeat until all the edges of the o/p matrix of all core members are visited.
```

-continued

FIG. 11A depicts exemplary sets of closed paths in a computing environment during a cache coherency test workflow, in accordance with one or more aspects of the present disclosure. Advantageously, striped transitions are achieved as a side effect of previous and/or other core transitions. Those sequenced can be reprioritized. FIGS. 11B-11E depict examples of striped transitions. Here, I→S→I, and I→M→T→I need not be inserted, as they are covered as a result of other transitions. Each test sequence can have a flush operation as a cleanup operation added to the end prior to starting the next test sequence. Note that only local transition sequences are depicted in the example of FIGS. 11A-11E. As noted, there can be a clustering of cache zones, depending on the scope of the state transitions to be achieved. If the transitions to be achieved are of local scope only (e.g., within a multicore processor), then the cluster can contain random cores within the nodal scope. If global scope transitions are desired (e.g., between processors, such as multicore processors), then the cluster can include random off-node cores as well.

The terminology used herein is for the purpose of describing particular embodiments only and is not intended to be limiting of the disclosure. As used herein, the singular forms "a", "and" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method of facilitating processing within a computing environment, the computer-implemented method comprising:

deterministically generating a test program to test cache coherency in the computing environment, the computing environment including multiple processing units, and the deterministically generating including:

generating a weighted multigraph to facilitate producing cache state test sequences, wherein the weighted multigraph comprises nodes representing cache states and connecting edges representing operations producing respective cache state transitions for the multiple processing units, and generating the weighted multigraph includes assigning weight priorities to cache state transitions based on whether the cache state transitions can be reached via interaction between processing units of the multiple processing units;

producing the cache state test sequences using graph traversal of the weighted multigraph, wherein the cache state test sequences comprise closed paths of cache-affecting operations; and pruning the cache state test sequences, using closed-path graph analysis and the weight priorities, to generate the test program, wherein the test program has a selected cache coherence test coverage using chosen cache state test sequences obtained from pruning the cache state test sequences; and initiating executing of the test program in the computing environment to test the cache coherency.

2. The computer-implemented method of claim 1, wherein the assigning includes assigning higher weight priority to cache state transitions which can be reached via interaction between processing units of the multiple processing units in order to process those cache state transitions before other cache state transitions of the weighted multigraph in obtaining the chosen cache state test sequences for the test program.

3. The computer-implemented method of claim 2, wherein generating the weighted multigraph further comprises generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processing units causes a cache state transition in another processing unit of the multiple processing units.

4. The computer-implemented method of claim 3, further comprising:

identifying the closed paths of cache-affecting operations from the weighted multigraph; and wherein the pruning of the cache state test sequences further comprises:

determining a total weight of each closed path of cache-affecting operations of the cache state test sequences; and processing the identified closed paths in descending order of the determined total weights in generating the test program.

5. The computer-implemented method of claim 4, wherein processing the identified closed paths comprises, for a selected closed path of the identified closed paths, identifying any secondary transitions of the selected closed path in the other processing unit, and using graph coloring processing to facilitate reprioritizing a processing order of the identified closed paths, the graph coloring processing producing a graph with nodes representing closed paths and connecting edges representing secondary paths generated as a result of processing the closed paths.

6. The computer-implemented method of claim 1, wherein the selected cache coherence test coverage ensures that executing the test program generates all desired cache state transitions in the computing environment for testing the cache coherency.

7. The computer-implemented method of claim 1, further comprising:

identifying, based on executing the test program in the computing environment, a cache coherency issue within the computing environment; and initiating a cache coherency-related production change to the computing environment to generate a modified computing environment with a cache-related modification to address the identified cache coherency issue.

8. The computer-implemented method of claim 7, further comprising:

initiating executing of another test program in the modified computing environment to test cache coherency of the modified computing environment.

9. A computer system for facilitating processing within a computing environment, the computer system comprising:

a memory; and at least one processor in communication with the memory, wherein the computer system is configured to perform a method, the method comprising:

deterministically generating a test program to test cache coherency in the computing environment, the computing environment including multiple processing units, and the deterministically generating including:

generating a weighted multigraph to facilitate producing cache state test sequences, wherein the weighted multigraph comprises nodes representing cache states and connecting edges representing operations producing respective cache state transitions for the multiple processing units, and generating the weighted multigraph includes assigning weight priorities to cache state transitions based on whether the cache state transitions can be reached via interaction between processing units of the multiple processing units;

producing the cache state test sequences using graph traversal of the weighted multigraph, wherein the cache state test sequences comprise closed paths of cache-affecting operations; and pruning the cache state test sequences, using closed-path graph analysis and the weight priorities, to generate the test program, wherein the test program has a selected cache coherence test coverage using chosen cache state test sequences obtained from pruning the cache state test sequences; and initiating executing of the test program in the computing environment to test the cache coherency.

10. The computer system of claim 9, wherein the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program.

11. The computer system of claim 10, wherein generating the weighted multigraph further comprises generating one or more forest of dependency graphs for use in the assigning of the weight priorities to the connecting edges of the weighted multigraph, where each node of the one or more forest of dependency graphs represents a cache state transition, and a connecting edge from one node to another node indicates that the cache state transition in one processing unit of the multiple processing units causes a cache state transition in another processing unit of the multiple processing units.

12. The computer system of claim 11, further comprising:

identifying the closed paths of cache-affecting operations from the weighted multigraph; and wherein the pruning of the cache state test sequences further comprises:

determining a total weight of each closed path of cache-affecting operations of the cache state test sequences; and processing the identified closed paths in descending order of the determined total weights in generating the test program.

13. The computer system of claim 12, wherein processing the identified closed paths comprises, for a selected closed path of the identified closed paths, identifying any secondary transitions of the selected closed path in the other processing unit, and using graph coloring processing to facilitate reprioritizing a processing order of the identified closed paths, the graph coloring processing producing a graph with nodes representing closed paths and connecting edges representing secondary paths generated as a result of processing the closed paths.

14. The computer system of claim 9, wherein the selected cache coherence test coverage ensures that executing the test program generates all desired cache state transitions in the computing environment for testing the cache coherency.

15. A computer program product for facilitating processing within a computing environment, the computer program product comprising:

one or more computer readable storage media and program instructions collectively stored on the one or more computer readable storage media readable by at least one processer to:

deterministically generate a test program to test cache coherency in the computing environment, where the computing environment includes multiple processing units, and the deterministically generating includes:

generating a weighted multigraph to facilitate producing cache state test sequences, wherein the weighted multigraph comprises nodes representing cache states and connecting edges representing operations producing respective cache state transitions for the multiple processing units, and generating the weighted multigraph includes assigning weight priorities to cache state transitions based on whether the cache state transitions can be reached via interaction between processing units of the multiple processing units;

producing the cache state test sequences using graph traversal of the weighted multigraph, wherein the cache state test sequences comprise closed paths of cache-affecting operations; and pruning the cache state test sequences, using closed-path graph analysis and the weight priorities, to generate the test program, wherein the test program has a selected cache coherence test coverage using chosen cache state test sequences obtained from pruning the cache state test sequences; and initiate executing of the test program in the computing environment to test the cache coherency.

16. The computer program product of claim 15, wherein the assigning includes assigning higher weight priority to cache state transitions which can be reached via interaction between processing units of the multiple processing units in order to process those cache state transitions before other cache state transitions of the weighted multigraph in obtaining the chosen cache state test sequences of the test program.

17. The computer program product of claim 16, further comprising:

identifying the closed paths of cache-affecting operations from the weighted multigraph; and wherein the pruning of the cache state test sequences further comprises:

determining a total weight of each closed path of cache-affecting operations of the cache state test sequences; and processing the identified closed paths in descending order of the determined total weights in generating the test program.

* * * * *